(12) United States Patent
Kim et al.

(10) Patent No.: US 9,748,941 B2
(45) Date of Patent: Aug. 29, 2017

(54) POWER SEMICONDUCTOR MODULE AND METHOD FOR STABILIZING THEREOF

(71) Applicant: Electronics and Telecommunications Research Institute, Daejeon (KR)

(72) Inventors: Minki Kim, Daejeon (KR); Hyun-Gyu Jang, Cheongju-si (KR); Dong Yun Jung, Daejeon (KR); Sang Choon Ko, Daejeon (KR); Hyun Soo Lee, Goyang-si (KR); Chi Hoon Jun, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/223,826

(22) Filed: Jul. 29, 2016

(65) Prior Publication Data

US 2017/0117889 A1    Apr. 27, 2017

(30) Foreign Application Priority Data

Oct. 27, 2015  (KR) .......................... 10-2015-0149694
Apr. 1, 2016   (KR) .......................... 10-2016-0040357

(51) Int. Cl.
*H03K 17/081*   (2006.01)
*H01L 29/778*   (2006.01)
*H01L 27/088*   (2006.01)
*H01L 29/20*    (2006.01)

(52) U.S. Cl.
CPC ... *H03K 17/08104* (2013.01); *H01L 27/0883* (2013.01); *H01L 29/2003* (2013.01); *H01L 29/778* (2013.01)

(58) Field of Classification Search
CPC ....................... H01L 27/0883; H03K 17/08104
See application file for complete search history.

(56) References Cited

U.S. PATENT DOCUMENTS

| | | | |
|---|---|---|---|
| 6,535,050 B2 * | 3/2003 | Baudelot | H03F 1/226 327/430 |
| 6,633,195 B2 * | 10/2003 | Baudelot | H01L 27/098 327/430 |
| 7,501,670 B2 | 3/2009 | Murphy | |
| 7,960,997 B2 | 6/2011 | Williams | |
| 8,084,783 B2 * | 12/2011 | Zhang | H01L 27/0605 257/109 |
| 8,487,667 B2 * | 7/2013 | Iwamura | H03K 17/567 327/108 |
| 8,502,478 B2 | 8/2013 | Kim et al. | |
| 8,766,275 B2 * | 7/2014 | Iketani | H01L 27/0605 257/379 |

(Continued)

Primary Examiner — Jeffrey Zweizig
(74) Attorney, Agent, or Firm — Rabin & Berdo, P.C.

(57) ABSTRACT

Provided is a stabilizing circuit structure using a sense field effect transistor (sense-FET). A power semiconductor module includes a depletion-mode field effect transistor (D-mode FET) and the sense FET that has same structure as the D-mode FET and varies in area. Also the power semiconductor module includes not only an enhancement-mode field effect transistor (E-mode FET), but also the stabilizing circuit including circuit elements such as a resistor, a capacitor, an inductor, or a diode.

10 Claims, 8 Drawing Sheets

(56) References Cited

U.S. PATENT DOCUMENTS

| | | | | |
|---|---|---|---|---|
| 8,847,235 B2* | 9/2014 | Rose | ............... | H03K 17/08122 |
| | | | | 257/76 |
| 8,958,189 B1* | 2/2015 | Weyers | ............... | H01L 27/0255 |
| | | | | 361/91.1 |
| 9,116,533 B2* | 8/2015 | Buthker | .................. | G05F 3/247 |
| 9,171,836 B2* | 10/2015 | Lal | ......................... | H01L 25/00 |
| 9,356,015 B2* | 5/2016 | Ohshima | .............. | H03K 17/102 |
| 9,431,391 B2* | 8/2016 | Ueno | ................ | H01L 27/0605 |
| 2009/0278513 A1* | 11/2009 | Bahramian | ......... | H01L 21/8258 |
| | | | | 323/217 |
| 2012/0262220 A1* | 10/2012 | Springett | ........ | H03K 17/04206 |
| | | | | 327/430 |
| 2012/0280271 A1* | 11/2012 | Ichikawa | ............. | H03K 17/107 |
| | | | | 257/133 |
| 2014/0042495 A1 | 2/2014 | Parikh et al. | | |
| 2014/0097685 A1 | 4/2014 | Jun et al. | | |
| 2014/0377930 A1 | 12/2014 | Lal et al. | | |

* cited by examiner

POWER SEMICONDUCTOR MODULE AND METHOD FOR STABILIZING THEREOF

CROSS-REFERENCE TO RELATED APPLICATIONS

This U.S. non-provisional patent application claims priority under 35 U.S.C. §119 to Korean Patent Application Nos. 10-2015-0149694, filed on Oct. 27, 2015, and 10-2016-0040357, filed on Apr. 1, 2016, the entire contents of which are hereby incorporated by reference.

BACKGROUND

The present disclosure herein relates to a power semiconductor, and more particularly, to a depletion-mode power semiconductor module that is capable of stabilizing an operation of a cascode power semiconductor by using a sense-FET of a depletion-mode power semiconductor and a method for stabilizing the same.

High-voltage or high-current power semiconductor modules are commonly used in driving-related industry fields such as brushless direct current (BLDC) motors.

The floating node is a node at which a source of a depletion-mode device and a drain of an enhancement-mode device contact each other. The overvoltage occurring in the floating node during the switching operation may act as a factor that breaks a gate of the enhancement-mode device or depletion-mode device.

SUMMARY

The present disclosure provides a stabilized power semiconductor module and a method for stabilizing the same.

The present disclosure also provides a power semiconductor module that suppresses or prevents an overvoltage occurring at a floating node of a cascode structure and a method for stabilizing the same.

An embodiment of the inventive concept provides a power semiconductor module including: a depletion-mode field effect transistor including a gate, a drain, and a source, the depletion-mode field effect transistor being served as a main transistor for power switching; a sense field effect transistor configured to share the gate and the drain of the depletion-mode field effect transistor, the sense field effect transistor having current driving ability less than that of the depletion-mode field effect transistor; an enhancement-mode field effect transistor configured to connect the drain to a floating node that is the source of the depletion-mode field effect transistor so as to form a cascode structure, the enhancement-mode field effect transistor being configured to drive the depletion-mode field effect transistor; a first stabilizing circuit connected between the floating node and a source of the sense field effect transistor to perform voltage stabilization of the floating node; and a second stabilizing circuit connected between a source of the enhancement-mode field effect transistor and the source of the sense field effect transistor to perform voltage stabilization of the floating node.

In an embodiment, the depletion-mode field effect transistor may be a D-mode field effect transistor (a D-mode FET) of an AlGaN/GaN high electron mobility transistor (HEMT), and a current conductive direction is parallel to a substrate. The depletion-mode field effect transistor and the sense field effect transistor may have a gate width ratio of N:1, where the N is an integer grater than 1. Also, the first stabilizing circuit may include passive circuit elements such as a resistor, a capacitor, and an inductor.

In an embodiment of the inventive concept, a power semiconductor module includes: a first mode field effect transistor including a gate, a drain, and a source, the depletion-mode field effect transistor being served as a main transistor for power switching; a sense field effect transistor configured to share the gate and the drain of the first mode field effect transistor, the sense field effect transistor having current driving ability less than that of the first mode field effect transistor; a second mode field effect transistor configured to connect the drain to a floating node that is the source of the first mode field effect transistor so as to form a cascode structure together with the first mode field effect transistor, the second mode field effect transistor being configured to drive the first mode field effect transistor; a first stabilizing device connected between the floating node and a source of the sense field effect transistor to perform voltage stabilization of the floating node when the power is switched on or off; and a second stabilizing device connected between a source of the second-mode field effect transistor and the source of the sense field effect transistor to perform voltage stabilization of the floating node when the power is switched on or off.

In an embodiment of the inventive concept, a method for stabilizing a voltage of a floating node of a power semiconductor module including a depletion-mode field effect transistor and an enhancement-mode field effect transistor includes: providing a sense field effect transistor, which shares a gate and a drain of the depletion-mode field effect transistor and has current driving ability less than that of the depletion-mode field effect transistor; and providing a passive circuit element between the floating node and a source of the sense field effect transistor to perform voltage stabilization of the floating node to which a source of the depletion-mode field effect transistor and the enhancement-mode transistor are connected. In an embodiment, the method may further include providing an active circuit element between a source of the enhancement-mode field effect transistor and the source of the sense field effect transistor to perform the voltage stabilization of the floating node. Also, the method may further include providing a passive circuit element between a source of the enhancement-mode field effect transistor and the source of the sense field effect transistor to perform the voltage stabilization of the floating node.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 2 is a view illustrating a layout structure of a depletion-mode field effect transistor group including a sense-FET in FIG. 1B;

DETAILED DESCRIPTION

Hereinafter, preferred embodiments will be described in more detail with reference to the accompanying drawings. In the following description, required elements to understand an operation according to the inventive concept are only explained, and it is noted that description of the other elements will be omitted not to obscure subject matters of the inventive concept.

Figure 1A:
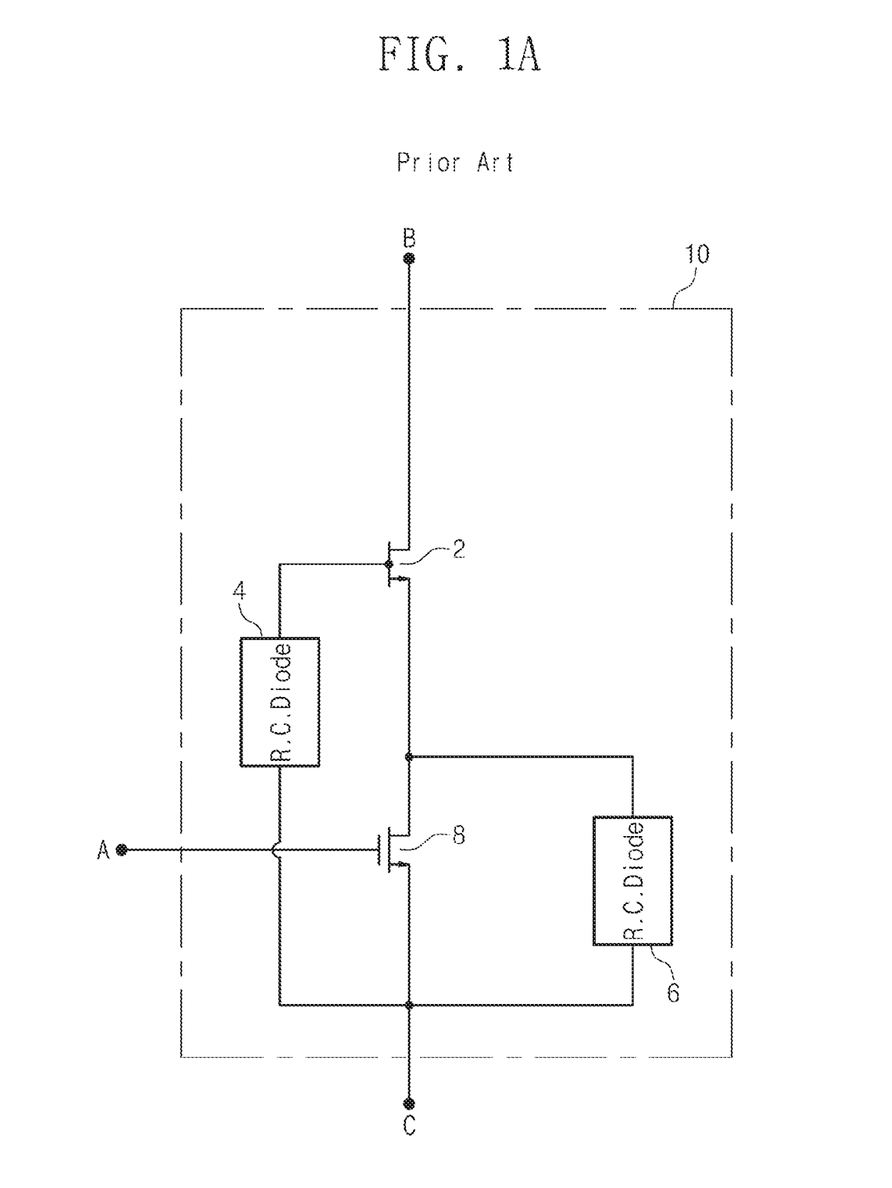
FIGS. 1A and 1B respectively illustrate a circuit structure of a typical power semiconductor module and a circuit structure of a power semiconductor module according to the inventive concept.
Figure 1B:
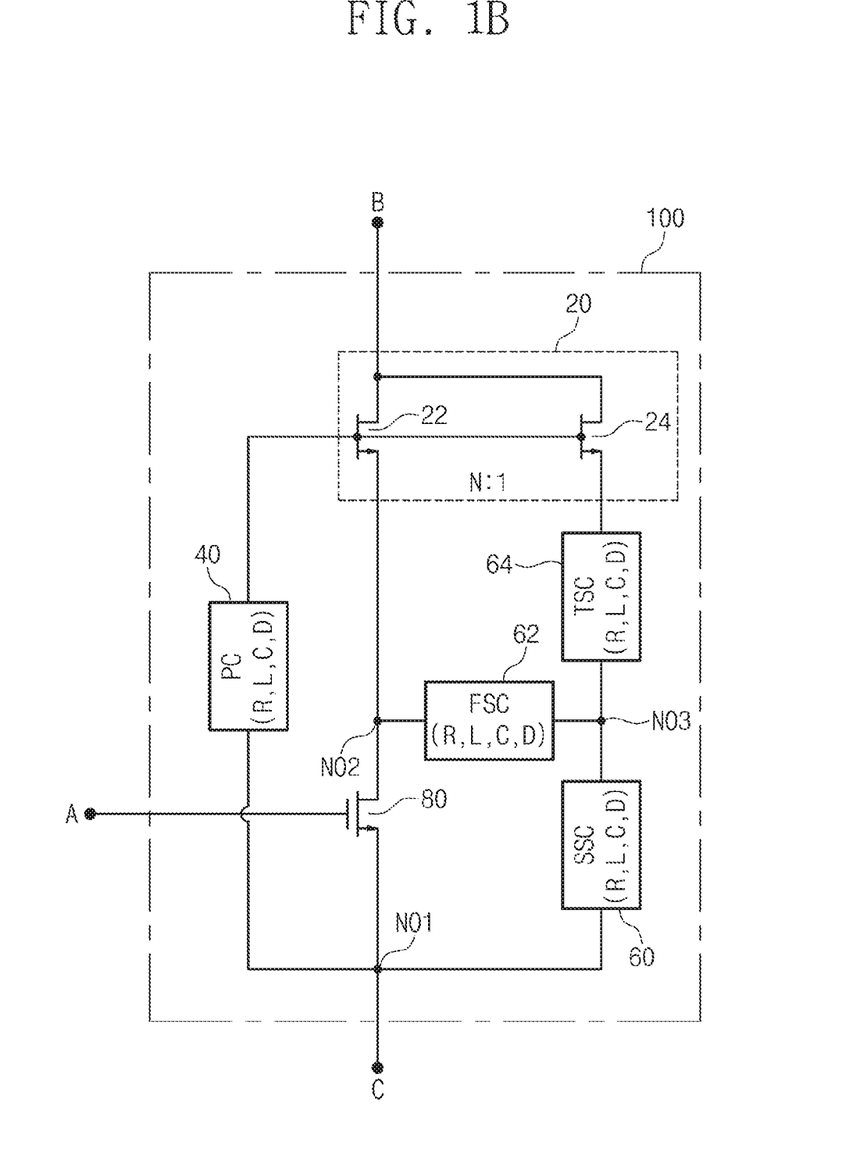

FIGS. 1A and 1B respectively illustrate a circuit structure of a typical power semiconductor module 10 and a circuit structure of a power semiconductor module 100 according to the inventive concept.

First, a circuit structure of a typical power semiconductor module 10 includes a depletion-mode (or a first mode) field effect transistor (D-mode FET) 2 and an enhancement-mode (or a second mode) field effect transistor (E-mode FET) 8, which have a cascode structure in FIG. 1A. In FIG. 1A, reference symbol B of a node represents a drain, reference symbol A of a node represents a gate, and reference symbol C of a node represents a source. Stabilizing units 4 and 6 each of which includes a resistor R, a capacitor C, or a diode D, are additionally connected to a gate and a source (floating node) of the D-node FET 2 to protect circuit devices each of which has the cascode structure. The stabilizing units 4 and 6 are devices for protecting the D-mode FET 2 and the E-mode FET 8 during the switching operation of the D-mode FET 2 or E-mode FET 8.

In the circuit structure of the power semiconductor module 10, a voltage of the floating node is determined by leakage current of the D-Mode FET 2 and the E-Mode FET 8. When it is assumed that the leakage current flows when switched off, a high voltage is applied to the drain B. The voltage of the floating node is determined according to a relationship in resistance between the D-mode FET 2 and the E-mode FET 8 when switched off. As a result, when the voltage of the drain B increases, the voltage of the floating node may increase together. To stabilize the voltage of the floating node, the stabilizing units 4 and 6 each of which includes the resistor R, the capacitor C, or the diode D disposed on the gate and the source (floating node) of the D-mode FET 2, may be further provided. For example, when the resistor is provided to each of the stabilizing units 4 and 6, parallel resistance of the E-mode FET 2 may decrease when switched off to somewhat reduce the voltage of the floating node. However, when the voltage of the drain B is risen, the voltage of the floating node may be risen together. When a zener diode is provided to each of the stabilizing units 4 and 6, the voltage of the floating node may have a level close to a reverse voltage of the zener diode. However, operation delay may occur when switched on/off to consume a large amount of current.

On the contrary, a power semiconductor module 100 according to the inventive concept includes a depletion-mode field effect transistor group 20 including a sense field effect transistor (sense-FET) 24. That is, the depletion-mode field effect transistor group 20 includes a depletion-mode field effect transistor (D-mode FET) 22 that functions as a main transistor for power switching and including a gate, a drain, and a source and the sense-FET 24 that shares the gate and the drain of the D-mode FET 22 and has current driving ability less than that of the D-mode FET 22. Thus, the D-mode FET 22 and the sense FET 24 may be connected parallel to each other and have a gate width ratio of N:1. Here, N is an integer greater than 1.

Also, the power semiconductor module 100 includes an enhancement-mode transistor (E-mode FET) 80 which connects the floating node NO2 that is a source of the D-mode FET 22 to the drain to form the cascode structure with respect to the D-mode FET 22 and drives the depletion-mode field effect transistor (D-mode FET) 22.

Also, the power semiconductor module 100 includes a first stabilizing circuit (FSC) 62, which is connected between the floating node NO2 and the source of the sense FET 24 to perform voltage stabilization of the floating node NO2.

Alternatively or selectively, the power semiconductor module 100 may include a second stabilizing circuit (SSC) 60, which is connected between the source of the E-mode FET 80 and the source of the sense FET 24 to perform voltage stabilization of the floating node NO2.

Also, additionally or selectively, the power semiconductor module 100 may include a third stabilizing circuit (TSC) 64, which is connected between the source of the sense FET 24 and the SSC 60 to perform voltage stabilization of the floating node NO2.

The FSC represents the first stabilizing circuit, the SSC represents the second stabilizing circuit, and the TSC represents the third stabilizing circuit.

When one device is used in the stabilizing circuit, the stabilizing circuit may be a stabilizing device.

Additionally or selectively, the power semiconductor module 100 may include a protection circuit 40 including a resistor, a capacitor, or a diode between the gate of the D-mode FET 22 (for example, a first mode) and the source of the E-mode FET 80 (for example, a second mode).

The semiconductor module 100 has a basic structure of the field effect transistors 22 and 80 each of which has the cascode structure. The sense FET 24 disposed in parallel to the D-Mode FET 22 in addition to the basic structure is provided. Also, the power semiconductor module 100 has a circuit structure in which the FSC 62 is connected to the floating node NO2.

Thus, when the power semiconductor module having the cascode structure is manufactured to provide the stabilizing circuit that is capable of being realized by using a resistor R, a capacitor C, an inductor L, or a diode D, superior performance and operation stability when compared with those of the typical power semiconductor module 10 may be obtained. Also, the manufacturing costs may be relatively reduced.

In FIG. 1B, the sense-FET 24 and the D-mode FET 22 have a size ratio of N:1.

A device structure of AlGaN/GaN hetero structure field-effect transistor (HFET) with which the sense FET 24 is manufactured together is illustrated in FIG. 2.

The sense-FET 24 shares the drain and the gate of the D-mode FET 22 that is a main-FET, and the source of the sense-FET 24 is isolated from the source of the D-mode FET 22. An amount of current flowing through the sense-FET 24 is determined by a ratio of a channel size (for example, a gate width) of the main-FET 22 and the sense-FET 24.

FIG. 2 is a view illustrating a layout structure of the depletion-mode field effect transistor group 20 including the sense-FET in FIG. 1B. Referring to FIG. 2, the layout of the depletion-mode field effect transistor group 20 of an AlGaN/GaN high electron mobility transistor (HEMT) is illustrated. Here, a current conductive direction of the D-mode FET 22 is parallel to a buffer layer L10. The buffer layer L10 is a buffer layer by a mesa isolation and functions as a substrate.

The D-mode FET 22 and the sense-FET 24 are disposed together on an active area L20 defined on a top surface of the substrate L10. Reference symbols D1 and G1 represent a drain and a gate, respectively. Also, reference symbol S1 represents a source, and reference symbol S2 represents a sense node of the sense-FET 24. The D-mode FET 22 and the sense-FET 24 have a current ratio that is proportional to an area ratio in the current conductive direction of the D-mode FET 22 and the sense-FET 24. That is, the current ratio may be proportional to a gate width ratio of the designed device. When the D-mode FET 22 and the sense-FET 24 have a width ratio of N:1, breakdown voltages are the same. Also, a ratio of a conductive current and a leakage current is N:1, and on resistance has an opposite ratio, i.e., a ratio of 1:N.

Figure 3:
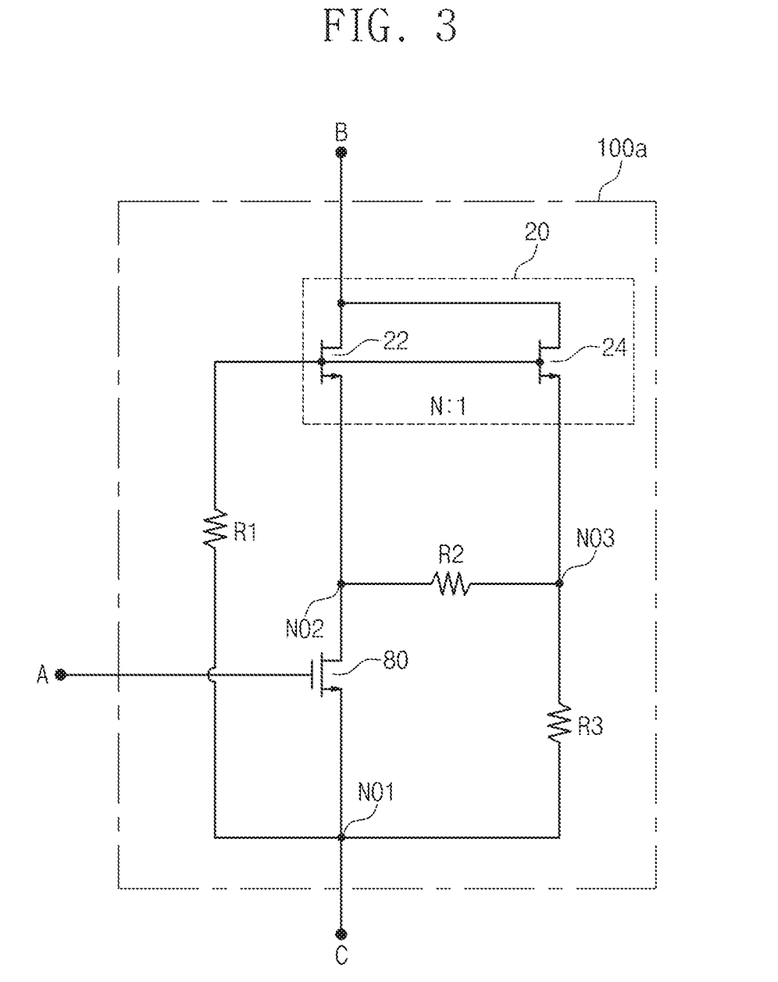
FIG. 3 is a detail view of a power semiconductor module according to an embodiment of the inventive concept.

FIG. 3 is a detail view of a power semiconductor module 100a according to an embodiment of the inventive concept. Referring to FIG. 3, in the structure of FIG. 1B, the FSC 62 is provided with a resistor R2, and the SSC 60 is provided with a resistor R3. Also, the protection circuit 40 is provided with a resistor R1. As described above, when stabilizing circuits are realized by using resistors that are passive circuit elements, since resistance values of an E-mode FET 80 and a D-mode FET 22 are relatively less than those of other resistors R1, R2, and R3 in a switch-on period of the power semiconductor module, most current flows to the E-mode FET 80. Since all of the D-mode FET 22 and a sense-FET 24 are turned off in a switching-off period, a floating node NO2 may be stabilized by a predetermined resistance value. In the circuit structure of FIG. 3, it is important to set the resistance values of the resistors R2 and R3.

Figure 4:
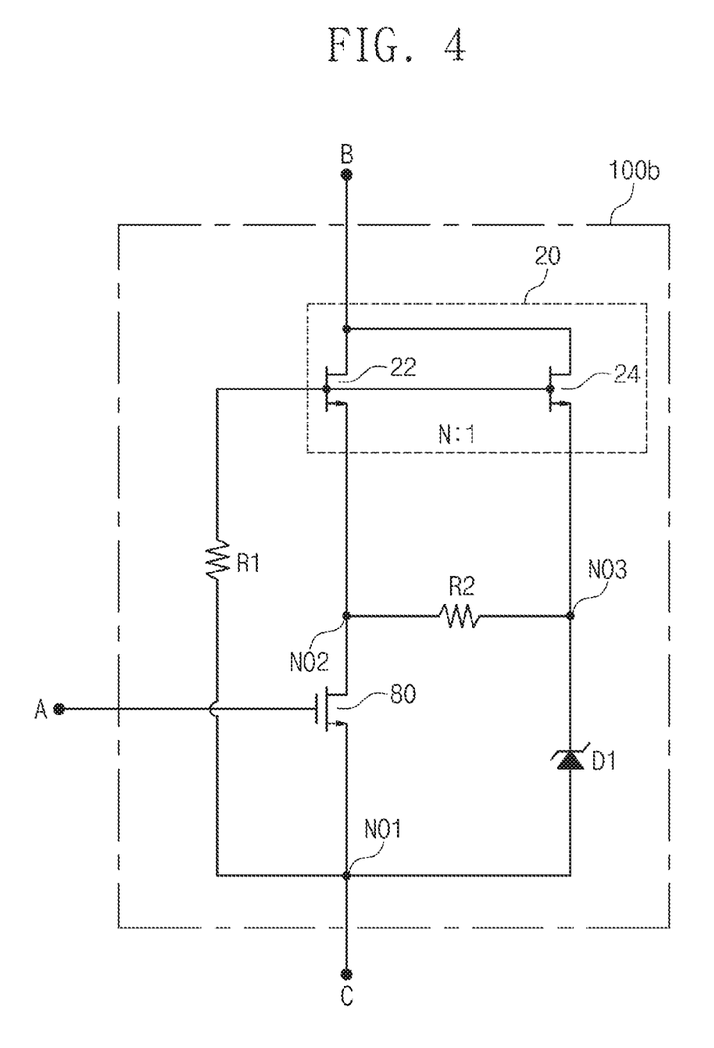
FIG. 4 is a detail view of a power semiconductor module according to another embodiment of the inventive concept.

FIG. 4 is a detail view illustrating a power semiconductor module 100b according to another embodiment of the inventive concept. Referring to FIG. 4, in the structure of FIG. 1B, the FSC 62 is provided with a resistor R2, and the SSC 60 is provided with a diode, for example, a zener diode D1. Also, the protection circuit 40 is provided with a resistor R1. In FIG. 4, the resistor R2 as the stabilizing circuit is disposed between nodes NO2 and NO3, and the zener diode D1 is disposed between a ground node NO1 that is a source of an E-mode FET 80 and a node NO3 that is a source of a sense-FET 24. In a switch-on period, current flows to the E-mode FET 80 by the resistor and the diode. A current passage is defined between the resistor and the diode to cause small current consumption. Voltage rising of the floating node NO2 is suppressed by the resistor R2 and the zener diode D1 in a switch-off period to stabilize the voltage. A voltage level of the floating node NO2 may vary according to a set resistance value of the resistor R2 and a voltage applied to a drain B.

Figure 5:
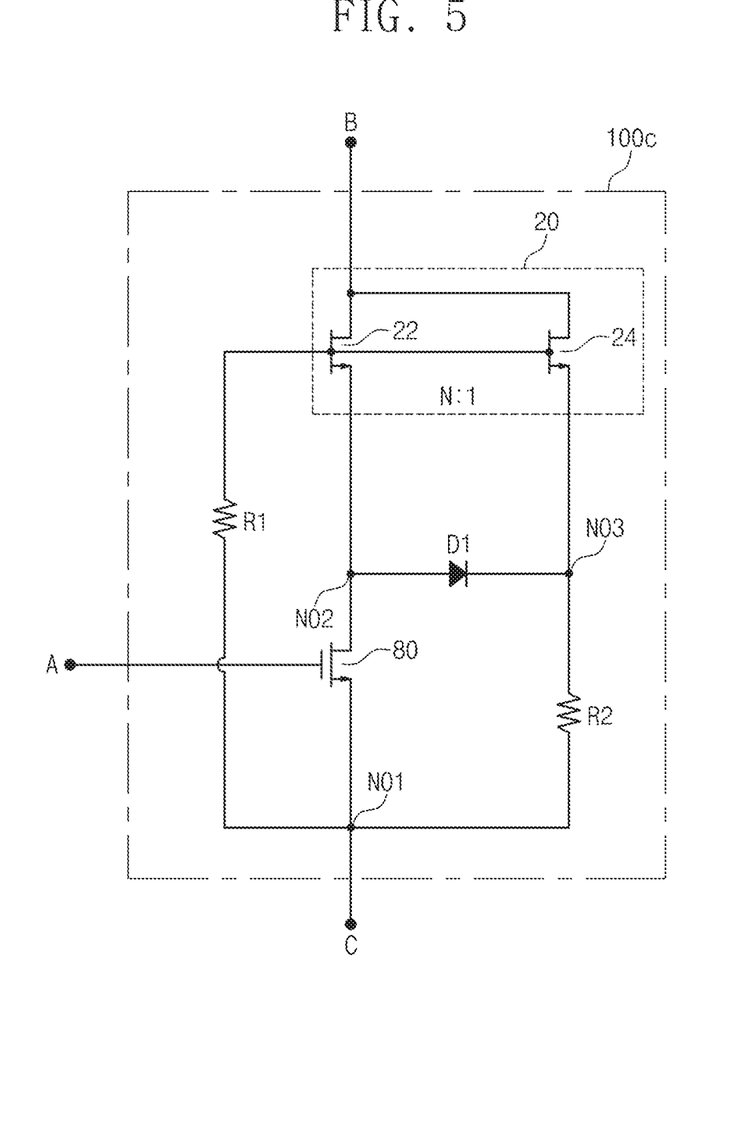
FIG. 5 is a detail view of a power semiconductor module according to another embodiment of the inventive concept.

FIG. 5 is a detail view of a power semiconductor module 100c according to another embodiment of the inventive concept. Referring to FIG. 5, in the structure of FIG. 1B, the FSC 62 is provided with a diode D1, and the SSC 60 is provided with a resistor R2. Also, the protection circuit 40 is provided with a resistor R1. Thus, in a circuit structure of FIG. 5, the diode D1 is disposed between a floating node NO2 and a node NO3 that is a source of a sense-FET 24, and the resistor R2 is disposed between a source node NO1 and the node NO3. In switch-on period, most current flows through the D-mode FET 22 that is a main-FET. The sense-FET 24 maintains an off-period intactly according to a set resistance value of the resistor R2. In a switch-off period, the voltage of the floating node NO2 may be stabilized by the diode D1 and the resistor R2.

Figure 6:
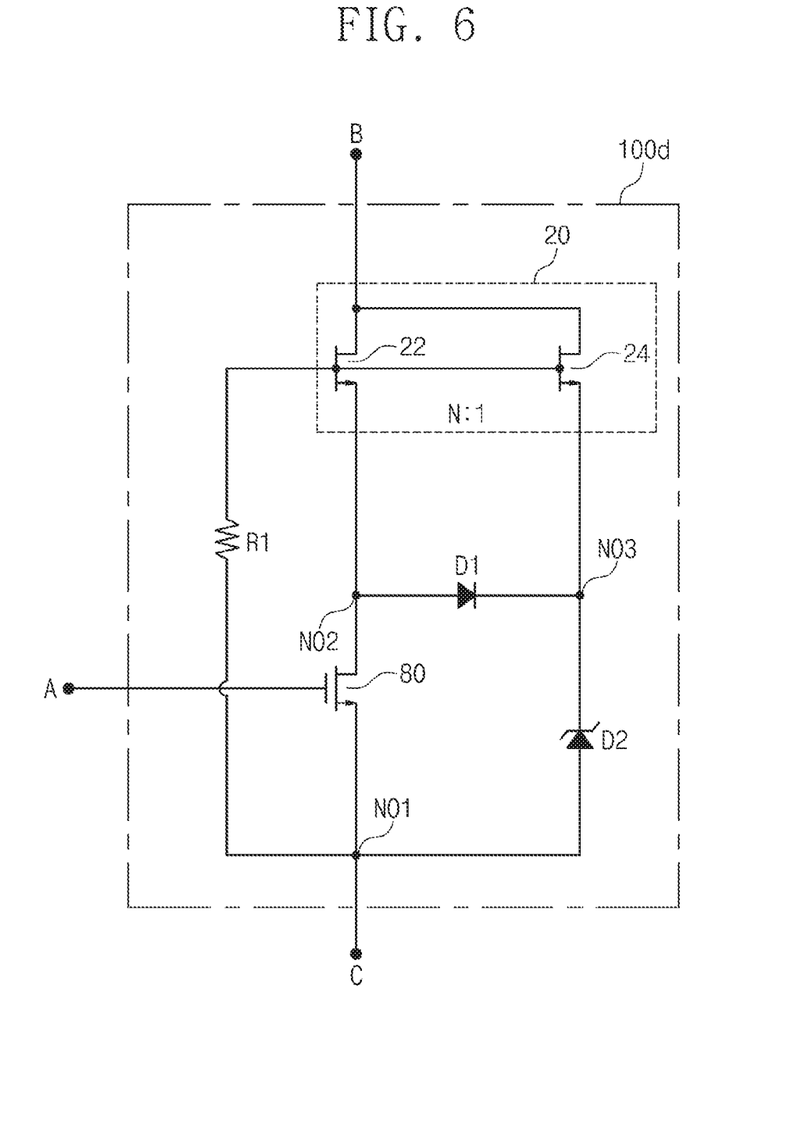
FIG. 6 is a detail view of a power semiconductor module according to another embodiment of the inventive concept.

FIG. 6 is a detail view of a power semiconductor module 100d according to another embodiment of the inventive concept. Referring to FIG. 6, in the structure of FIG. 1B, the FSC 62 is provided with a diode D1, and the SSC 60 is provided with a zener diode D2. Also, the protection circuit 40 consists of a resistor R1. In a structure of FIG. 6, the sense-FET 24 maintains an off-state in a switch-on period, and thus, current flows through the depletion-mode field effect transistor 22 that is an main-FET. Leakage current may be consumed in the two diodes D1 and D2. In a switch-off period, a rising voltage of a floating node NO2 is maintained as a reverse voltage of the zener diode D2. Thus, the voltage rising of the floating node NO2 is suppressed. Therefore, the voltage stabilization is achieved.

Figure 7:
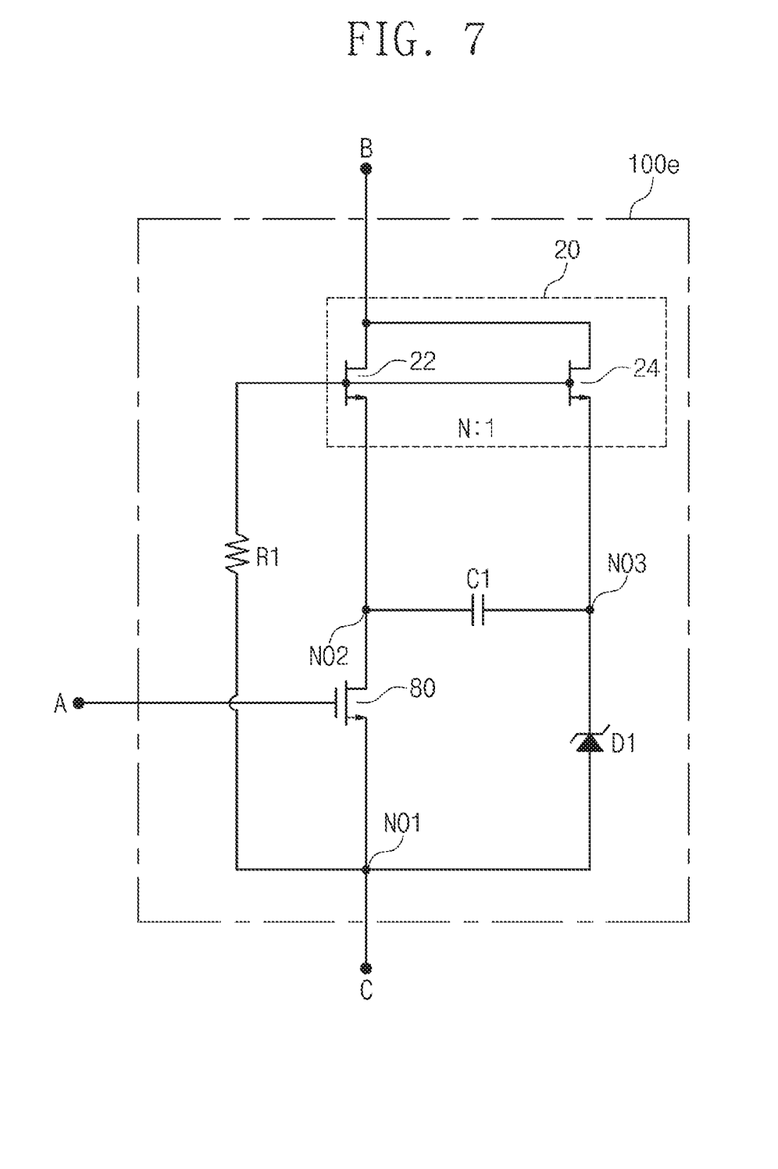
FIG. 7 is a detail view of a power semiconductor module according to another embodiment of the inventive concept.

FIG. 7 is a detail view of a power semiconductor module 100e according to another embodiment of the inventive concept. Referring to FIG. 7, in the structure of FIG. 1B, the FSC 62 is provided with a capacitor C1 that is a passive circuit element, and the SSC 60 is provided with a zener diode D1. Also, the protection circuit 40 is provided with a resistor R1. In a structure of FIG. 7, a sense-FET 24 maintains an off-state by the zener diode D1 in a switch-on period of the power semiconductor module 100e. Current flows through a D-mode FET 22 that is a main-FET. In a switch-off period, voltage rising of a floating node NO2 is suppressed due to adjustment in quantity of electric charges by the capacitor C1. Thus, a voltage of the floating node NO2 may be stabilized by an operation of the capacitor C1.

Figure 8:
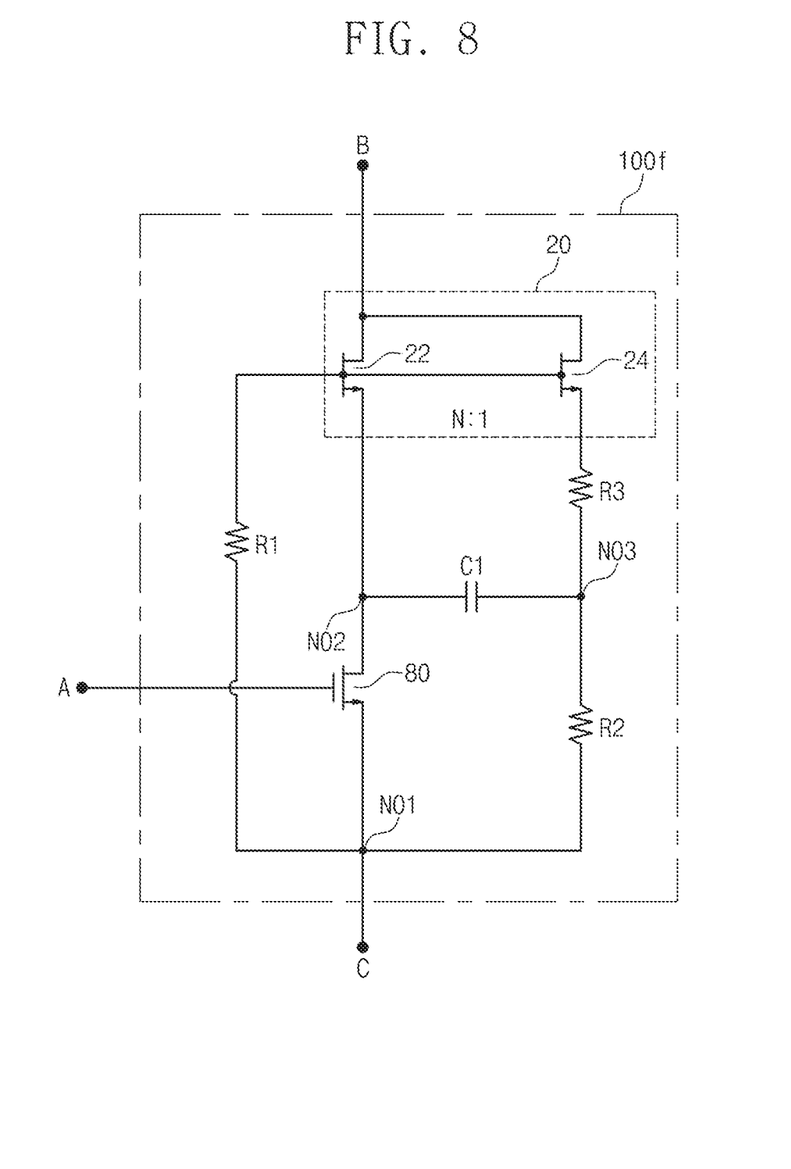
FIG. 8 is a detail view of a power semiconductor module according to another embodiment of the inventive concept.

FIG. 8 is a detail view of a power semiconductor module 100f according to another embodiment of the inventive concept. Referring to FIG. 8, the structure of FIG. 1B, the FSC 62 in is provided with a capacitor C1 that is a passive circuit element, and the SSC 60 is provided with a resistor R2. Also, the TSC 64 is provided with a resistor R3.

Also, the protection circuit 40 is provided with a resistor R1. In a structure of FIG. 8, a sense-FET 24 maintains an off-state by the resistor R2 in a switch-on period of the power semiconductor module 100f. Current flows through a D-mode FET 22 that is a main-FET. In a switch-off period, voltage rising of a floating node NO2 may be suppressed due to adjustment in quantity of electric charges by the capacitor C1, like FIG. 7. That is, a voltage of the floating node NO2 may be stabilized by an operation of the capacitor C1.

Also, as the TSC 64 is added in FIG. 8, a divided voltage according to a resistance ratio between the resistor R3 and the resistor R2 of the second stabilizing circuit 60 is generated at the node NO3.

Thus, a resistance value of the resistor R3 is adjusted to stabilize the voltage of the floating node NO2.

As described above, the power semiconductor module having the cascode structure includes the stabilizing circuit capable of being realized by using the resistor R, the capacitor C, or the diode D. The power semiconductor module having the cascode structure may include the stabilizing circuit to achieve the relatively superior performance and operation stability. Also, the specifications required for forming the power semiconductor module may be relatively lowered. Therefore, the manufacturing costs of the power semiconductor module may be relatively reduced.

The embodiment of the inventive concept proposes the stabilizing circuit structure in the power semiconductor module using the sense-FET. Thus, the voltage rise at the floating node may be suppressed. Also, the amount of current consumed in the power semiconductor module may be reduced. Therefore, the specifications required for forming the depletion-mode transistor and the specifications required for the breakdown voltage of the enhancement-mode transistor may be lowered. The production costs of the power semiconductor module having the cascode structure may be relatively reduced by the low requirement specification.

While this disclosure has been particularly shown and described with reference to preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present disclosure.

What is claimed is:

1. A power semiconductor module comprising:
   a depletion-mode field effect transistor comprising a gate, a drain, and a source, the depletion-mode field effect transistor being served as a main transistor for power switching;
   a sense field effect transistor configured to share the gate and the drain of the depletion-mode field effect transistor, the sense field effect transistor having current driving ability less than that of the depletion-mode field effect transistor;
   an enhancement-mode field effect transistor having a drain, which is connected to a floating node that is the source of the depletion-mode field effect transistor so as to form a cascode structure, the enhancement-mode field effect transistor being configured to drive the depletion-mode field effect transistor;
   a first stabilizing circuit connected between the floating node and a source of the sense field effect transistor to perform voltage stabilization of the floating node; and
   a second stabilizing circuit connected between a source of the enhancement-mode field effect transistor and the source of the sense field effect transistor to perform voltage stabilization of the floating node.

2. The power semiconductor module of claim 1, wherein the depletion-mode field effect transistor is a D-mode field effect transistor (a D-mode FET) of an AlGaN/GaN high electron mobility transistor (HEMT), and a current conductive direction is parallel to a substrate.

3. The power semiconductor module of claim 1, wherein the depletion-mode field effect transistor and the sense field effect transistor have a gate width ratio of N:1, where the N is an integer grater than 1.

4. The power semiconductor module of claim 1, wherein the first stabilizing circuit comprises a passive circuit element.

5. The power semiconductor module of claim 1, wherein the second stabilizing circuit comprises at least one of a resistor, a capacitor, or an inductor.

6. The power semiconductor module of claim 1, the second stabilizing circuit comprises a Zener diode.

7. A power semiconductor module comprising:
   a first mode field effect transistor comprising a gate, a drain, and a source, the first mode field effect transistor being served as a main transistor for power switching;
   a sense field effect transistor configured to share the gate and the drain of the first mode field effect transistor, the sense field effect transistor having current driving ability less than that of the first mode field effect transistor;
   a second mode field effect transistor having a drain, which is connected to a floating node that is the source of the first mode field effect transistor so as to form a cascode structure together with the first mode field effect transistor, the second mode field effect transistor being configured to drive the first mode field effect transistor;
   a first stabilizing device connected between the floating node and a source of the sense field effect transistor to perform voltage stabilization of the floating node when the power is switched on or off; and
   a second stabilizing device connected between a source of the second-mode field effect transistor and the source of the sense field effect transistor to perform voltage stabilization of the floating node when the power is switched on or off.

8. The power semiconductor module of claim 7, wherein a resistor, a capacitor, or a diode is further connected to between the gate of the first mode field effect transistor and the source of the second mode field effect transistor.

9. A method for stabilizing a voltage of a floating node of a power semiconductor module comprising a depletion-mode field effect transistor and an enhancement-mode field effect transistor, the method comprising:
   providing a sense field effect transistor, which shares a gate and a drain of the depletion-mode field effect transistor and has current driving ability less than that of the depletion-mode field effect transistor; and
   providing a passive circuit element between the floating node and a source of the sense field effect transistor to perform voltage stabilization of the floating node to which a source of the depletion-mode field effect transistor and the enhancement-mode transistor are connected.

10. The method of claim 9, further comprising providing a passive circuit element between a source of the enhancement-mode field effect transistor and the source of the sense field effect transistor to perform the voltage stabilization of the floating node.

* * * * *